(12) United States Patent
Hwang

(10) Patent No.: US 11,238,798 B2
(45) Date of Patent: *Feb. 1, 2022

(54) ORGANIC LIGHT EMITTING DISPLAY

(71) Applicant: SAMSUNG DISPLAY CO., LTD., Yongin-si (KR)

(72) Inventor: Young-In Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/714,523

(22) Filed: Dec. 13, 2019

(65) Prior Publication Data

US 2020/0118493 A1 Apr. 16, 2020

Related U.S. Application Data

(63) Continuation of application No. 16/372,285, filed on Apr. 1, 2019, now Pat. No. 10,510,300, which is a
(Continued)

(30) Foreign Application Priority Data

Apr. 29, 2010 (KR) .................. 10-2010-0040043

(51) Int. Cl.
  *G09G 3/3258* (2016.01)
  *G09G 3/3208* (2016.01)
  *H01L 27/32* (2006.01)

(52) U.S. Cl.
  CPC ......... *G09G 3/3258* (2013.01); *G09G 3/3208* (2013.01); *G09G 2300/0426* (2013.01);
  (Continued)

(58) Field of Classification Search
  None
  See application file for complete search history.

(56) References Cited

U.S. PATENT DOCUMENTS 7,336,036 B2 * 2/2008 Furuie ................ H01L 27/3211
                                                                315/169.1
7,592,982 B2 * 9/2009 Kwak .................. G09G 3/3233
                                                                345/76
(Continued)

FOREIGN PATENT DOCUMENTS

JP    2007-220598 A    8/2007
KR    2001-0000907      1/2001
(Continued)

OTHER PUBLICATIONS

KIPO Office action dated Nov. 27, 2012, for Korean priority Patent application 10-2010-0040043, (1 page).
(Continued)

*Primary Examiner* — Duane N Taylor, Jr.
(74) *Attorney, Agent, or Firm* — Lewis Roca Rothgerber Christie LLP

(57) ABSTRACT

An organic light emitting display is capable of reducing variation in power transmitted to pixels to reduce or prevent non-uniformity of brightness from being generated. The organic light emitting display includes a pixel including a red sub pixel, a green sub pixel, and a blue sub pixel and first pixel power source lines for supplying a first pixel power from a first pixel power source to the red sub pixel, the green sub pixel, and the blue sub pixel, wherein the first pixel power source lines coupled to at least two different color sub pixels of the red, green and blue sub pixels have different widths. The first pixel power source lines have widths that may correspond to a voltage drop of the first pixel power source or may correspond to deterioration of the respective sub pixels to which they are coupled.

14 Claims, 4 Drawing Sheets

Related U.S. Application Data continuation of application No. 15/253,395, filed on Aug. 31, 2016, now Pat. No. 10,290,259, which is a continuation of application No. 12/953,343, filed on Nov. 23, 2010, now abandoned.

(52) U.S. Cl.
CPC ............... *G09G 2300/0452* (2013.01); *G09G 2300/0465* (2013.01); *G09G 2320/0223* (2013.01); *G09G 2320/0233* (2013.01); *G09G 2320/0242* (2013.01); *G09G 2320/045* (2013.01); *G09G 2320/0666* (2013.01); *G09G 2330/00* (2013.01); *G09G 2330/02* (2013.01); *H01L 27/3211* (2013.01); *H01L 27/3279* (2013.01)

(56) References Cited

U.S. PATENT DOCUMENTS

| | | | | |
|---|---|---|---|---|
| 7,737,933 | B2* | 6/2010 | Yamano | G09G 3/3696 345/94 |
| 2005/0093802 | A1* | 5/2005 | Yamazaki | H05B 33/08 345/92 |
| 2005/0285830 | A1* | 12/2005 | Iwabuchi | G09G 3/20 345/77 |
| 2006/0284803 | A1* | 12/2006 | Ikeda | G09G 3/3233 345/76 |
| 2009/0027375 | A1* | 1/2009 | Ryu | G09G 3/3208 345/212 |
| 2010/0141693 | A1* | 6/2010 | Lee | G09G 3/3216 345/694 |
| 2010/0157131 | A1* | 6/2010 | Kamatani | H01L 51/5265 348/333.11 |
| 2011/0050666 | A1* | 3/2011 | Inoue | G09G 3/30 345/211 |
| 2011/0157122 | A1* | 6/2011 | Tsai | H01L 27/3279 345/211 |
| 2011/0181630 | A1* | 7/2011 | Smith | G09G 3/3283 345/690 |
| 2011/0298694 | A1* | 12/2011 | Nieh | H01L 27/3279 345/76 |

FOREIGN PATENT DOCUMENTS

| | | |
|---|---|---|
| KR | 10-2008-0108918 | 10/2006 |
| KR | 10-2006-0114477 A | 11/2006 |
| KR | 10-2009-0078633 | 7/2009 |

OTHER PUBLICATIONS

KIPO Office action dated Sep. 7, 2011, for Korean priority Patent application 10-2010-0040043, (3 pages).

\* cited by examiner

ORGANIC LIGHT EMITTING DISPLAY

CROSS-REFERENCE TO RELATED APPLICATION

This application is a continuation of U.S. patent application Ser. No. 16/372,285, filed Apr. 1, 2019, which is a continuation of U.S. patent application Ser. No. 15/253,395, filed Aug. 31, 2016, now U.S. Pat. No. 10,290,259, which is a continuation of U.S. patent application Ser. No. 12/953,343, filed Nov. 23, 2010, which claims priority to and the benefit of Korean Patent Application No. 10-2010-0040043, filed on Apr. 29, 2010, in the Korean Intellectual Property Office, the entire content of all of which is incorporated herein by reference.

BACKGROUND

1. Field

An embodiment of the present invention relates to an organic light emitting display.

2. Description of Related Art

Recently, various flat panel displays (FPDs) capable of reducing weight and volume, which are disadvantages of cathode ray tubes (CRTs), have been developed. The FPDs include liquid crystal displays (LCDs), field emission displays (FEDs), plasma display panels (PDPs), and organic light emitting displays.

Among the FPDs, the organic light emitting display displays an image using organic light emitting diodes (OLEDs) that generate light by the recombination of electrons and holes.

The organic light emitting displays are being widely applied in personal digital assistants (PDAs), MP3 players, and mobile telephones due to advantages such as excellent color reproducibility and reduced thickness.

FIG. 1 is a circuit diagram illustrating a pixel of an organic light emitting display. Referring to FIG. 1, the pixel is coupled to a data line Dm, a scan line Sn, and a pixel power source line coupled to a pixel power source ELVDD and includes a first transistor M1, a second transistor M2, a capacitor Cst, and an organic light emitting diode OLED.

In the first transistor M1, a source is coupled to the pixel power source line ELVDD, a drain is coupled to the OLED, and a gate is coupled to a first node N1. In the second transistor M2, a source is coupled to the data line Dm, a drain is coupled to the first node N1, and a gate is coupled to the scan line Sn. The capacitor Cst is coupled between the first node N1 and the pixel power source ELVDD to maintain a voltage between the first node N1 and the pixel power source ELVDD for an amount of time (e.g., a predetermined time). The OLED includes an anode electrode, a cathode electrode, and a light emitting layer. In the OLED, the anode electrode is coupled to the drain of the first transistor M1 and the cathode electrode is coupled to a low potential power source ELVSS, so that when current flows from the anode electrode to the cathode electrode, the light emitting layer emits light, and brightness is controlled corresponding to the amount of current.

In the pixel having the above structure, current corresponding to EQUATION flows to the OLED.

$$I_d = \frac{\beta}{2}(Vgs-Vth)^2 = \frac{\beta}{2}(ELEVdd - Vdata - Vth)^2 \quad \text{EQUATION 1}$$

wherein, $I_d$, Vgs, Vth, ELVdd, Vdata, and $\beta$ represent current that flows to the OLED, a voltage between the gate and source of the first transistor, a threshold voltage of the first transistor, a voltage of the pixel power source, a voltage of the data signal, and a constant, respectively.

Since the current that flows to the OLED is as represented by EQUATION 1, when the voltage of the pixel power source ELVDD changes, the amount of current that flows also changes.

Therefore, since a magnitude of internal resistance of the pixel power source line to which the pixel power source ELVDD is coupled varies with a distance of the pixel from the pixel power source ELVDD, a difference in brightness between pixels may be generated.

SUMMARY

Accordingly, embodiments of the present invention have been made to provide an organic light emitting display capable of reducing variations in power transmitted to pixels to reduce or prevent non-uniformity of pixel brightness.

In order to achieve the foregoing and/or other aspects of the present invention, according to a first aspect of the present invention, there is provided an organic light emitting display including a pixel including a red sub pixel, a green sub pixel, and a blue sub pixel and first pixel power source lines for supplying a first pixel power from a first pixel power source to the red sub pixel, the green sub pixel, and the blue sub pixel, wherein the first pixel power source lines coupled to at least two different color sub pixels of the red, green and blue sub pixels have different widths.

The widths of the first pixel power source lines may correspond to a voltage drop of the first pixel power source.

The widths of the first pixel power source lines may correspond to deterioration of the respective sub pixels to which they are coupled.

The first pixel power source lines coupled to the blue sub pixels may have a largest width among the first pixel power source lines.

The organic light emitting display may further include a data driver for transmitting data signals to the pixel and a scan driver for transmitting scan signals to the pixel.

The first pixel power source lines coupled to the green sub pixels may have a smallest width among the first pixel power source lines.

The first pixel power source lines may include a first main pixel power source line electrically coupled to a first sub pixel power source line.

In the organic light emitting display according to embodiments of the present invention, variation in the power transmitted to pixels is reduced to reduce or prevent non-uniformity of pixel brightness. In addition, a change in an aperture ratio is reduced, making it possible to reduce or prevent brightness deterioration.

BRIEF DESCRIPTION OF THE DRAWINGS

The accompanying drawings, together with the specification, illustrate exemplary embodiments of the present invention, and, together with the description, serve to explain the principles of embodiments of the present invention, wherein.

DETAILED DESCRIPTION

Figure 1:
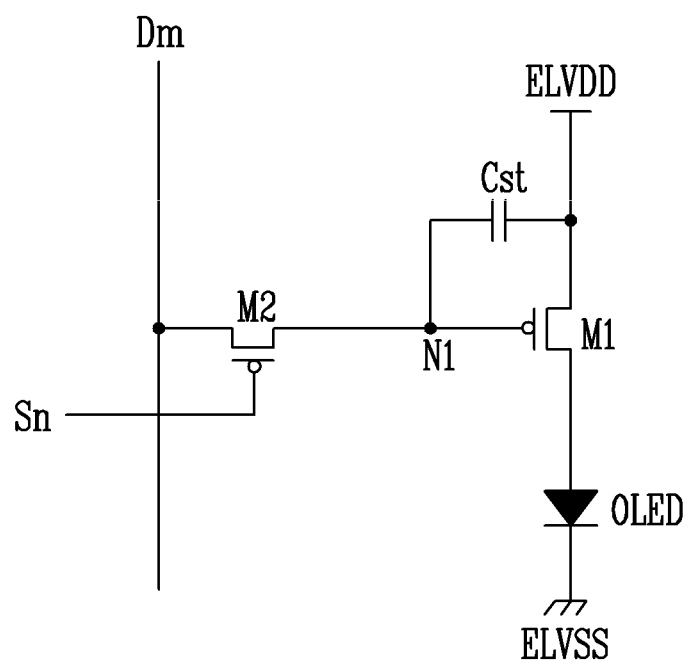
FIG. 1 is a circuit diagram illustrating a pixel of an organic light emitting display.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" or "coupled to" another element, it can be directly connected to the element or be indirectly connected to the element with one or more intervening elements interposed therebetween. Hereinafter, like reference numerals refer to like elements.

Hereinafter, embodiments of the present invention will be described as follows with reference to the attached drawings.

Figure 2:
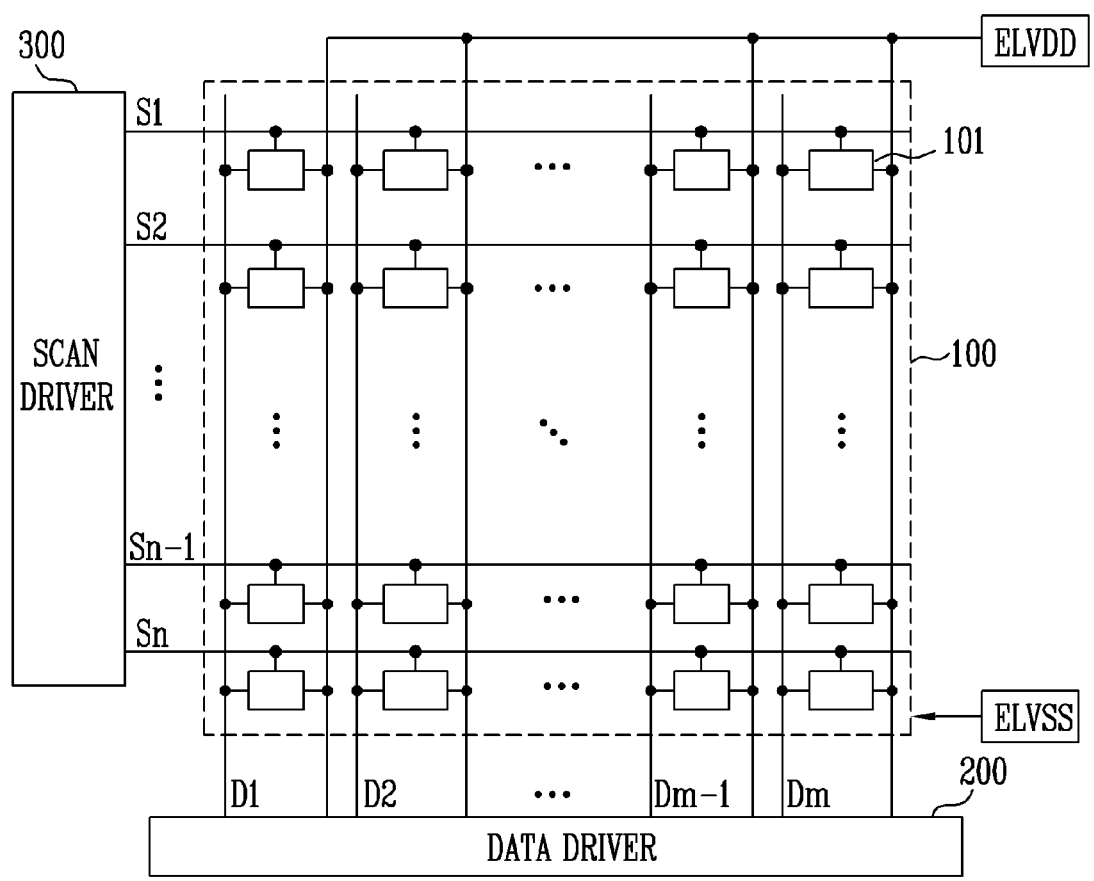
FIG. 2 is a schematic diagram illustrating an organic light emitting display according to an embodiment of the present invention.
Figure 3A:
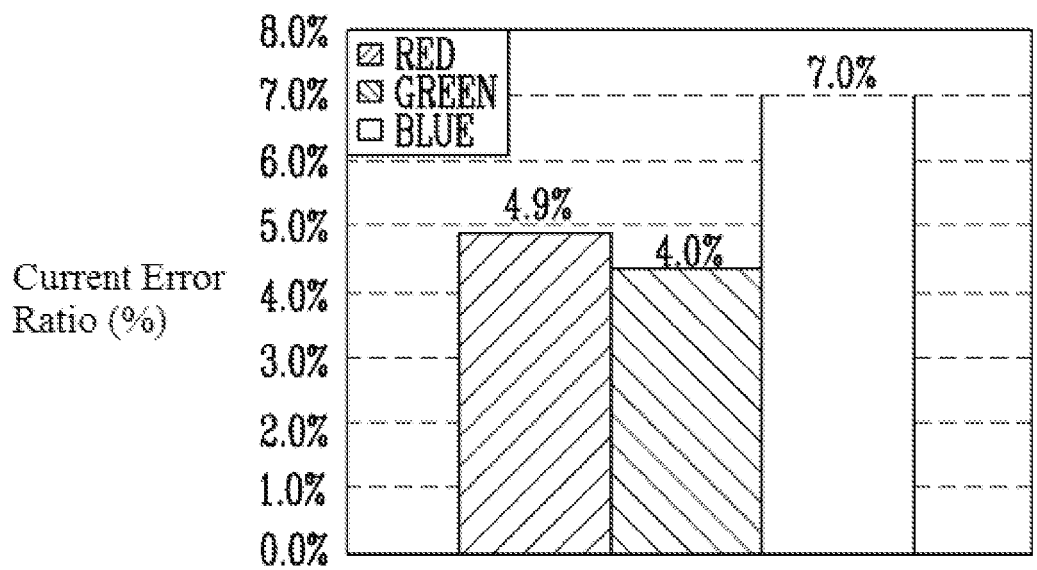
FIG. 3A is a graph illustrating the current error ratios of a red sub pixel, a green sub pixel, and a blue sub pixel, which are caused by the internal resistance of first pixel power source lines.
Figure 3B:
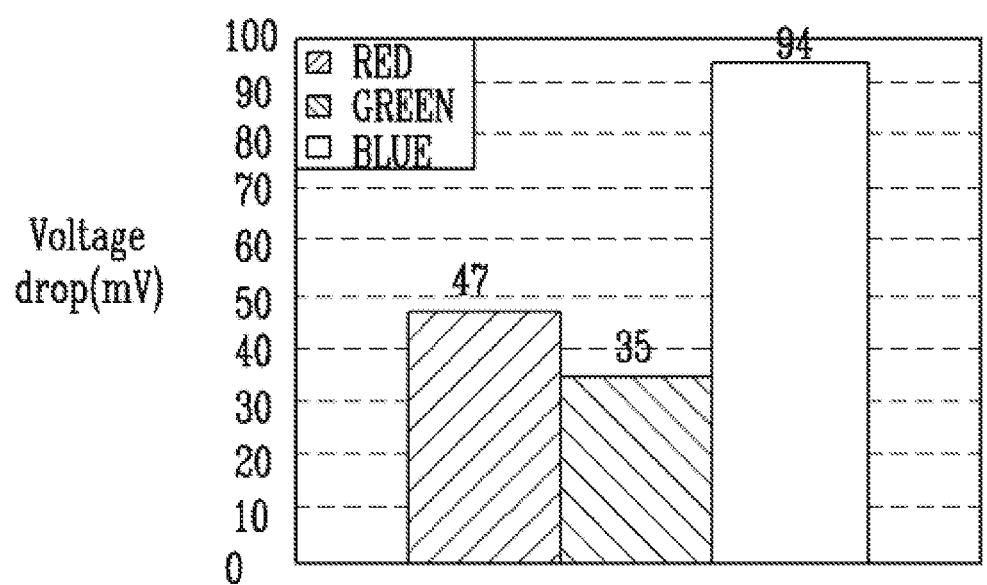
FIG. 3B is a graph illustrating the voltage drops of the red sub pixel, the green sub pixel, and the blue sub pixel, which are caused by the internal resistance of the first pixel power source lines.

FIG. 2 is a schematic diagram illustrating an organic light emitting display according to an embodiment of the present invention. FIG. 3A is a graph illustrating current error ratios of a red sub pixel, a green sub pixel, and a blue sub pixel, which are caused by internal resistance of first pixel power source lines. FIG. 3B is a graph illustrating voltage drops of the red sub pixel, the green sub pixel, and the blue sub pixel, which are caused by the internal resistance of the first pixel power source lines.

Referring to FIG. 2, the organic light emitting display includes a display unit 100, a data driver 200, and a scan driver 300. The display unit 100 includes a plurality of data lines D1, D2, . . . , Dm−1, and Dm, a plurality of scan lines S1, S2, . . . , Sn−1, and Sn, and a plurality of pixels 101 formed in regions defined by the plurality of data lines D1, D2, . . . , Dm−1, and Dm and the n scan lines S1, S2, . . . , Sn−1, and Sn. In addition, each of the pixels 101 receives power from a first pixel power source ELVDD and a second pixel power source ELVSS to be driven. At this time, the power from the first pixel power source ELVDD is received (e.g., commonly received) through a plurality of first pixel power source lines and the power from the second pixel power source ELVSS is received (e.g., commonly received) through an electrode deposited on the front surface of the display unit.

Each pixel 101 includes a red sub pixel, a green sub pixel, and a blue sub pixel. In addition, each of the sub pixels includes a pixel circuit and an organic light emitting diode (OLED), and generates pixel current that flows from the pixel circuit to the pixel corresponding to data signals transmitted through the plurality of data lines D1, D2, . . . , Dm−1, and Dm and scan signals transmitted through the plurality of scan lines S1, S2, . . . , Sn−1, and Sn, so that the pixel current flows to the OLED.

At this time, as illustrated in FIGS. 3A and 3B, the current error ratios and the voltage drops of a red sub pixel, a green sub pixel, and a blue sub pixel, which are caused by the internal resistance of the first pixel power source lines being different from each other, are shown. For example, the current error ratio of the blue sub pixel is 7%, the current error ratio of the red sub pixel is 4.9%, and the current error ratio of the green sub pixel is 4.4%. In addition, the voltage drop of the blue sub pixel is 94 mV, the voltage drop of the red sub pixel is 47 mV, and the voltage drop of the green sub pixel is 35 mV. The current error ratio and voltage drop of the blue sub pixel are larger than the current error ratios and voltage drops of the red sub pixel and the green sub pixel. Therefore, the non-uniformity of brightness of the blue sub pixel is larger than the non-uniformity of brightness of the other two sub pixels. A width of the first pixel power source lines may be increased to reduce the current error ratios and voltage drops of the first pixel power source lines. However, when the width of the first pixel power source lines is increased as if all of the first pixel power source lines are coupled to blue sub pixels, the widths of the first pixel power source lines coupled to red sub pixels and green sub pixels are unnecessarily large, and an aperture ratio is reduced.

Therefore, according to an embodiment of the present invention, widths of the first pixel power source lines of the sub pixels vary. That is, the thicknesses (or widths) of the first pixel power source lines coupled to the red sub pixel, the green sub pixel, and the blue sub pixel vary (e.g., are independently set) so that the width of the first pixel power source line coupled to the red sub pixel is determined in accordance with the voltage drop and current error ratio of the red sub pixel, and the width of the first pixel power source line coupled to the green sub pixel is determined in accordance with the voltage drop and current error ratio of the green sub pixel. In addition, the width of the first pixel power source line coupled to the blue sub pixel is determined in accordance with the voltage drop and current error ratio of the blue sub pixel.

The data driver 200 is coupled to the m data lines D1, D2, . . . , Dm−1, and Dm and generates data signals to sequentially transmit the data signals row-by-row to the m data lines D1, D2, . . . , Dm−1, and Dm (e.g., to the data lines one row at a time).

The scan driver 300 is coupled to the n scan lines S1, S2, . . . , Sn−1, and Sn and generates scan signals to transmit the scan signals to the n scan lines S1, S2, . . . , Sn−1, and Sn. A specific row (e.g., a specific scan line) is selected by the scan signals and the data signals are transmitted to the pixels 101 positioned in the selected row so that currents corresponding to the data signals are generated in the pixels.

Figure 4:
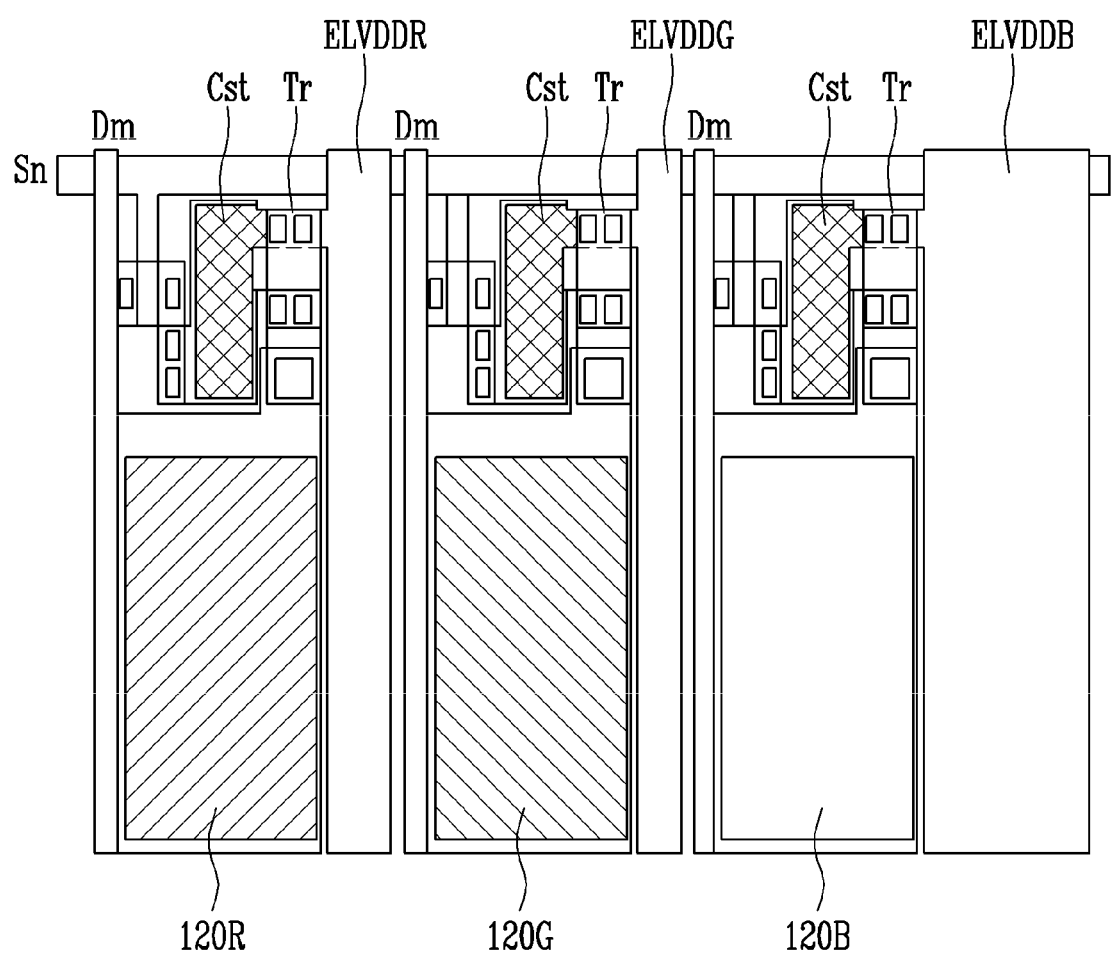
FIG. 4 is a layout diagram illustrating the pixel of the embodiment shown in FIG. 2.

FIG. 4 is a layout diagram illustrating the pixel of the embodiment shown in FIG. 2. Referring to FIG. 4, the pixel includes a red sub pixel 120R, a green sub pixel 120G, and a blue sub pixel 120B.

Each of the red sub pixel 120R, the green sub pixel 120G, and the blue sub pixel 120B includes a transistor Tr and a storage capacitor Cst. The red sub pixel 120R, the green sub pixel 120G, and the blue sub pixel 120B are coupled to the scan line Sn and the data line Dm, and are coupled to first pixel power source lines, e.g., a first pixel power source line ELVDDR for supplying the first pixel power source ELVDD to the red sub pixel 120R, a first pixel power source line ELVDDG for supplying the first pixel power source ELVDD to the green sub pixel 120G, and a first pixel power source line ELVDDB for supplying the first pixel power source ELVDD to the blue sub pixel 120B.

Referring to FIG. 4, the first pixel power source lines ELVDDR, ELVDDG, and ELVDDB are adjacent each other in a first direction. A distance between a center of the first pixel power source line ELVDDR in the first direction and a center of the adjacent first pixel power source line ELVDDG in the first direction is smaller than a distance between the center of the first pixel power source line ELVDDG in the first direction and a center of the adjacent first pixel power source line ELVDDB in the first direction. Also, a distance between the adjacent sub pixels 120R, 120G, and 120B in the same row and adjacent to each other varies due to the different distances between the first pixel power source lines ELVDDR, ELVDDG, and ELVDDB. In addition, widths of the data lines Dm are smaller than the widths of the first pixel power source lines ELVDDR, ELVDDG, and ELVDDB.

At this time, as illustrated in FIGS. 3A and 3B, since the voltage drop and the current error rate generated by the first pixel power source line ELVDDB coupled to the blue sub pixel 120B are largest, and since the voltage drop and the current error rate generated by the first pixel power source line ELVDDG coupled to the green sub pixel 120G are smallest, the width of the first pixel power source line ELVDDB coupled to the blue sub pixel 120B is largest, and the width of the first pixel power source line ELVDDG coupled to the green sub pixel 120G is smallest.

As described above, when the width of the first pixel power source lines is determined in accordance with the voltage drops and current error ratios of the respective sub pixels to which the first pixel power source lines are coupled, the sum of the widths of all of the first pixel power source lines is smaller than if the width of all of the first pixel power source lines were determined in accordance with only the sub pixel whose efficiency is lowest.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising: a plurality of pixels respectively comprising a plurality of sub pixels; a first power source line located between at least two of the sub pixels and coupled to at least one of the sub pixels; and a second power source line located between at least two of the sub pixels and coupled to at least one of other sub pixels different from the at least one of the sub pixels coupled to the first power source line from among the plurality of sub pixels, wherein the first power source line has a greater width than the second power source line.

2. The organic light emitting display as claimed in claim 1, wherein the first and second power source lines do not overlap the sub pixels.

3. The organic light emitting display as claimed in claim 1, wherein a distance between sub pixels adjacent to the first power source line from among the plurality of sub pixels is greater than a distance between sub pixels adjacent to the second power source line from among the plurality of sub pixels.

4. The organic light emitting display as claimed in claim 3, wherein a distance between a center of the first power source line and a center of the second power source line is varied corresponding to the widths of the first and second power source lines.

5. The organic light emitting display as claimed in claim 1, wherein the widths of the power source lines are in accordance with a voltage drop of a power source supplied to the sub pixels to which they are coupled.

6. The organic light emitting display as claimed in claim 1, wherein the widths of the power source lines correspond to deterioration of the sub pixels to which they are coupled.

7. The organic light emitting display as claimed in claim 1,
wherein the sub pixels comprise a blue sub pixel, a red sub pixel and a green sub pixel, and
wherein the blue, red and green sub pixels are arranged adjacent each other in a first direction.

8. The organic light emitting display as claimed in claim 7, further comprising a common pixel power source line,
wherein the first power source line is coupled to the common pixel power source line and to the at least one of the sub pixels to supply a first pixel power to the at least one of the sub pixels, the first power source line extending in a second direction perpendicular to the first direction and being offset from the at least one of the sub pixels, and
wherein the second power source line is coupled to the common pixel power source line and to the at least one of the other sub pixels to supply the first pixel power to the at least one of the other sub pixels, the second power source line extending in the second direction and being offset from the at least one of the other sub pixels.

9. The organic light emitting display as claimed in claim 7, wherein the first power source line is coupled to the blue sub pixel, and the second power source line is coupled to the green sub pixel.

10. The organic light emitting display as claimed in claim 9, further comprising:
a third power source line coupled to the red sub pixel,
wherein the first power source line has a larger width than the third power sour line.

11. The organic light emitting display as claimed in claim 9,
wherein a distance between the red sub pixel and the green sub pixel arranged in a same row and located adjacent to each other is larger than a distance between the green sub pixel and the blue sub pixel arranged in the same row and located adjacent to each other, and a distance between the blue sub pixel and the red sub pixel arranged in the same row and located adjacent to each other is larger than the distance between the red sub pixel and the green sub pixel arranged in the same row and located adjacent to each other.

12. The organic light emitting display as claimed in claim 1, further comprising:
a data driver to transmit data signals to the sub pixels through data lines; and
a scan driver to transmit scan signals to the sub pixels through scan lines.

13. The organic light emitting display as claimed in claim 12,
wherein widths of the data lines are smaller than widths of the power source lines.

14. An organic light emitting display comprising: a plurality of pixels respectively comprising a plurality of sub pixels; a first power source line coupled to at least one of the sub pixels; and a second power source line coupled to at least one of other sub pixels different from the at least one of the sub pixels coupled to the first power source line from among the plurality of sub pixels, wherein the first power source line has a greater width than the second power source line, and wherein a distance between sub pixels adjacent to the first power source line from among the plurality of sub pixels is greater than a distance between sub pixels adjacent to the second power source line from among the plurality of sub pixels.

* * * * *